US008697341B2

(12) United States Patent
Yoon et al.

(10) Patent No.: US 8,697,341 B2
(45) Date of Patent: Apr. 15, 2014

(54) AROMATIC RING CONTAINING POLYMER, UNDERLAYER COMPOSITION INCLUDING THE SAME, AND ASSOCIATED METHODS

(75) Inventors: Kyong-Ho Yoon, Uiwang-si (KR); Jin-Kuk Lee, Uiwang-si (KR); Hwan-Sung Cheon, Uiwang-si (KR); Min-Soo Kim, Uiwang-si (KR); Jee-Yun Song, Uiwang-si (KR)

(73) Assignee: Cheil Industries, Inc., Gumi-Si, Kyeongsanbuk-Do (KR)

( * ) Notice: Subject to any disclaimer, the term of this patent is extended or adjusted under 35 U.S.C. 154(b) by 133 days.

(21) Appl. No.: 13/151,531

(22) Filed: Jun. 2, 2011

(65) Prior Publication Data

US 2011/0229828 A1 Sep. 22, 2011

Related U.S. Application Data

(63) Continuation of application No. PCT/KR2009/007120, filed on Dec. 1, 2009.

(30) Foreign Application Priority Data

Dec. 2, 2008 (KR) .................. 10-2008-0121350

(51) Int. Cl.
*G03F 7/11* (2006.01)

(52) U.S. Cl.
USPC ........ 430/313; 528/353; 430/271.1; 430/323; 438/952

(58) Field of Classification Search
None
See application file for complete search history.

(56) References Cited

U.S. PATENT DOCUMENTS

| 2006/0269867 A1 | 11/2006 | Uh et al. |
| 2008/0160461 A1 | 7/2008 | Yoon et al. |
| 2013/0089716 A1* | 4/2013 | Krishnamurthy et al. . 428/195.1 |

FOREIGN PATENT DOCUMENTS

| FR | 2650829 A | * | 2/1991 |
| FR | 2650829 A1 | | 2/1991 |
| JP | 09-307203 A | * | 11/1977 |
| JP | 2000-352821 | | 12/2000 |
| KR | 10-0671120 B1 | | 1/2007 |
| KR | 10-0836675 B1 | | 6/2008 |
| TW | 200643623 | | 12/2006 |
| WO | WO-2006/126776 A1 | | 11/2006 |
| WO | WO-2008/082241 A1 | | 7/2008 |

OTHER PUBLICATIONS

Dine-Hart et al , "Effect of Structural Variations on the Thermo-oxidative Stability of Aromatic Polyimides", Die Makromolekulare Chemie, Volu. 153, year 1972, pp. 237-254.*

English translation of Desciption and claims of FR 2650829 generated at European Patent office at http://translationportal.epo.org. On Dec. 8, 2012 , 7 pages.*

Nah et al "Intercalation behavior of polyimide/oranoclay nanocomposites during thermal imidization", Composites PartB; engineering, 35 (2004), pp. 125-131 obtained from http://www.journals.elsevier.com/composites-part-b-engineering.*

Yang et al , "Effects of Various Factors on the Formation of High Molecular Weight Polyamic Acid", Jouranl of Applied POlymer Science VOI. 30, year 1985 pp. 2883-2905.*

(Continued)

*Primary Examiner* — Cynthia Hamilton
(74) *Attorney, Agent, or Firm* — Lee & Morse, P.C.

(57) ABSTRACT

An aromatic ring-containing polymer, an underlayer composition including the same, and associated methods, the aromatic ring-containing polymer including a group represented by one of the following Chemical Formulae 1-1, 1-2, 2-1, and 2-2:

[Chemical Formula 1-1]

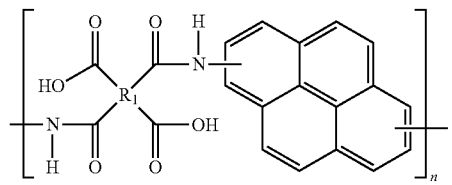

[Chemical Formula 1-2]

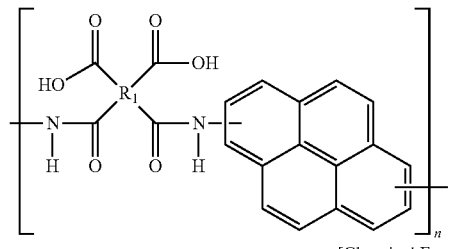

[Chemical Formula 2-1]

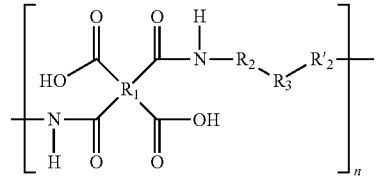

[Chemical Formula 2-2]

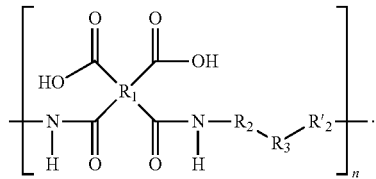

15 Claims, No Drawings

(56) References Cited

OTHER PUBLICATIONS

CAS Registry No. 20882-04-6 obtained from https://scifinder.cas.org/scifinder/view/scifinder/scifinderExplore.jsf[May 13, 2013 10:32:31 AM] 5 pages.*

Alam et al "Thermal Behavior of ethynyl and ethenyl terminated imide resins" Journal of Thermal Analysis, vol. 51, (1998) pp. 275-284.*

Goto et al "Polymer Design for Thermally Stable Polyimides with Low Dielectric Constant", Macromol. Symp. year 2003, vol. 199 pp. 321-331.*

English translation of JP, 09-307203, A (1997) from machine translation from AIPN Japan Patent Office National Center for Industrial Property Information and Training, generated Mar. 14, 2013, 9 pages.*

PCT Search Report dated Jul. 8, 2010.

Chinese Search Report in CN 200980148064.3, dated Apr. 25, 2013, with English translation (Yoon, et al.).

Taiwanese Search Report in TW 098140969, dated Jan. 9, 2013 (Yoon, et al.).

* cited by examiner

AROMATIC RING CONTAINING POLYMER, UNDERLAYER COMPOSITION INCLUDING THE SAME, AND ASSOCIATED METHODS

CROSS-REFERENCE TO RELATED APPLICATION

This application is a continuation of pending International Application No. PCT/KR2009/007120, entitled "Underlayer Composition Having Anti-Reflective Property," which was filed on Dec. 1, 2009, the entire contents of which are hereby incorporated by reference.

BACKGROUND

1. Field

Embodiments relate to an aromatic ring-containing polymer, an underlayer composition including the same, and associated methods.

2. Description of the Related Art

It is desirable to reduce the size of structural shapes in the microelectronics industry and other related industries, including the manufacture of microscopic structures (e.g., micromachines and magneto-resist heads). In the microelectronics industry, a reduction in the size of microelectronic devices may provide a greater number of circuits in a given chip size.

Effective lithographic techniques may facilitate a reduction in the size of structural shapes. Lithography affects the manufacture of microscopic structures from the viewpoint of direct imaging of patterns on particular substrates and production of masks typically used for such imaging.

SUMMARY

Embodiments are directed to an aromatic ring-containing polymer, an underlayer composition including the same, and associated methods.

The embodiments may be realized by providing an aromatic ring-containing polymer including a group represented by one of the following Chemical Formulae 1-1, 1-2, 2-1, and 2-2:

[Chemical Formula 1-1]

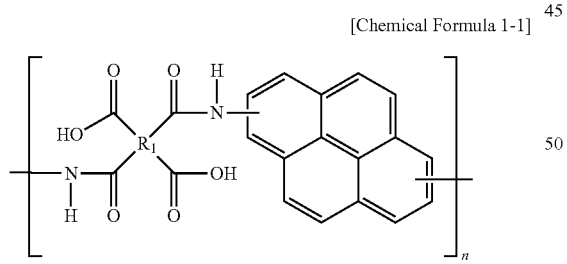

[Chemical Formula 1-2]

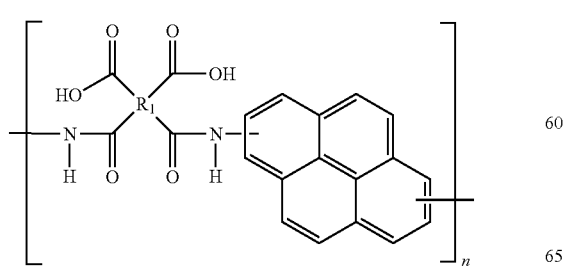

wherein, in Chemical Formulae 1-1 and 1-2, $1 \leq n < 250$ and $R_1$ is a moiety represented by one of the following Chemical Formula 1A:

[Chemical Formula 1A]

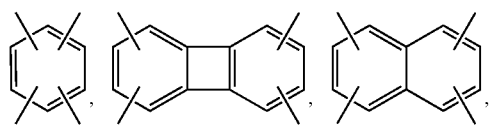

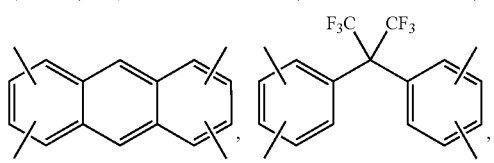

[Chemical Formula 2-1]

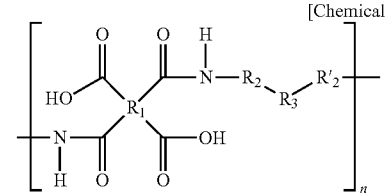

[Chemical Formula 2-2]

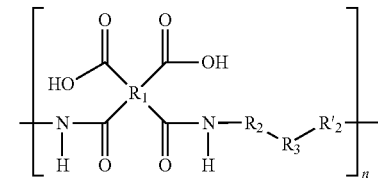

wherein, in Chemical Formulae 2-1 and 2-2, $1 \leq n < 250$, $R_1$ is the same as in Chemical Formula 1, each $R_2$ and $R'_2$ is independently a moiety represented by one of the following Chemical Formula 2A, and $R_3$ is a moiety represented by one of the following Chemical Formula 2B:

[Chemical Formula 2A]

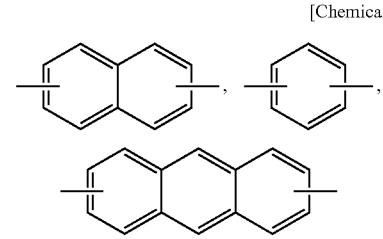

[Chemical Formula 2B]

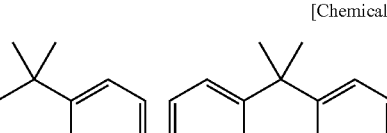

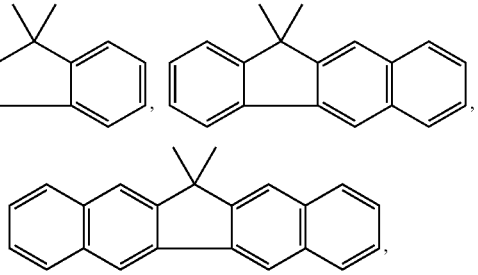

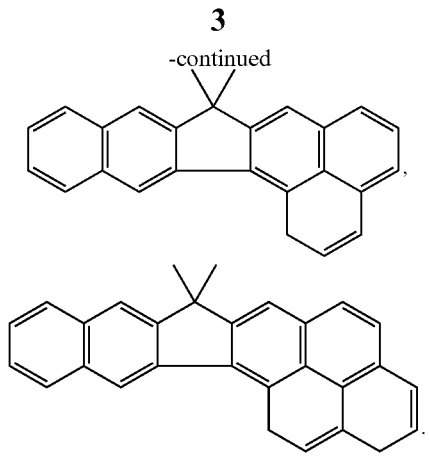

The aromatic ring-containing polymer may have a weight average molecular weight of about 1,000 to about 50,000.

The moiety represented by Chemical Formula 1A may be represented by the following Chemical Formula 1A(i):

[Chemical Formula 1A(i)]

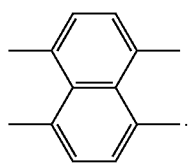

The embodiments may also be realized by providing an anti-reflective underlayer composition including an organic solvent; and an aromatic ring-containing polymer including a group represented by at least one of Chemical Formulae 1-1, 1-2, 2-1, and 2-2,

[Chemical Formula 1-1]

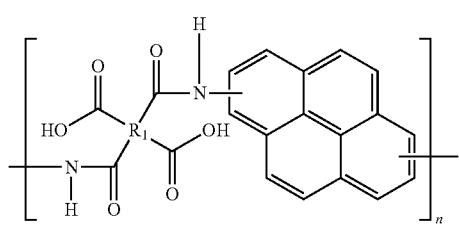

[Chemical Formula 1-2]

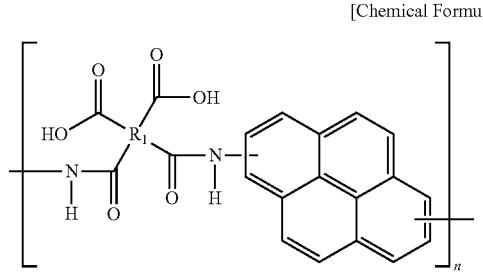

wherein, in Chemical Formulae 1-1 and 1-2, $1 \leq n < 250$, $R_1$ is a moiety represented by one of the following Chemical Formula 1A,

[Chemical Formula 1A]

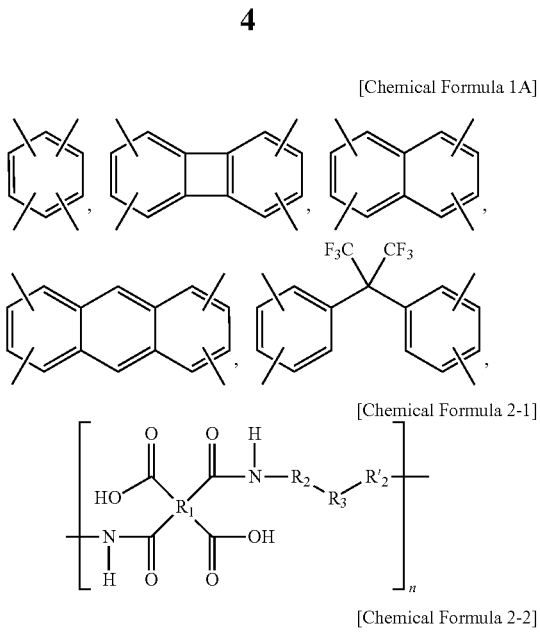

[Chemical Formula 2-1]

[Chemical Formula 2-2]

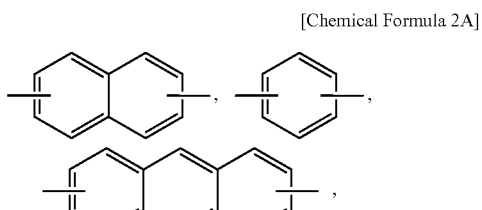

wherein, in Chemical Formulae 2-1 and 2-2, $1 \leq n < 250$, $R_1$ is the same as in Chemical Formula 1, each $R_2$ and $R'_2$ is independently a moiety represented by one of the following Chemical Formula 2A, and $R_3$ is a moiety represented by one of the following Chemical Formula 2B:

[Chemical Formula 2A]

[Chemical Formula 2B]

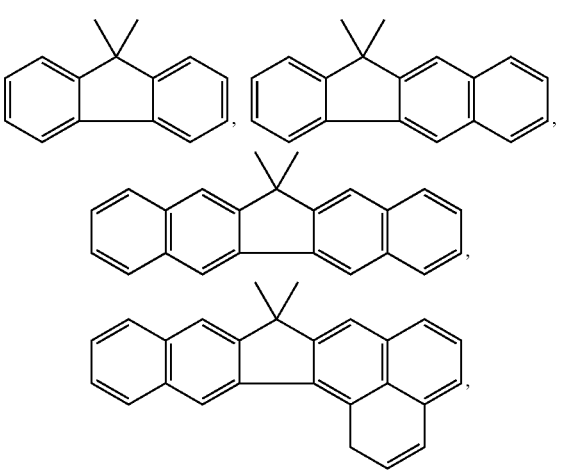

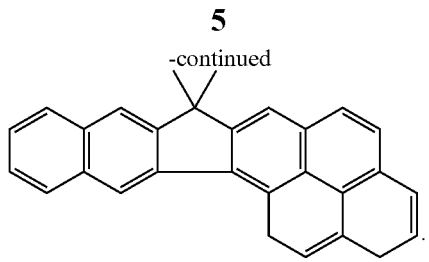

The moiety represented by Chemical Formula 1A may be represented by the following Chemical Formula 1A(i):

[Chemical Formula 1A(i)]

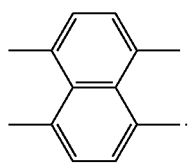

The underlayer composition may include about 1 to about 30 wt % of the aromatic ring-containing polymer; and about 70 to about 99 wt % of the organic solvent, based on a total weight of the composition.

The underlayer composition may include about 3 to about 15 wt % of the aromatic ring-containing polymer, based on the total weight of the composition.

The aromatic ring-containing polymer may have a weight average molecular weight of about 1,000 to about 50,000.

The anti-reflective underlayer composition may further include a surfactant.

The organic solvent may include at least one of propylene glycol monomethyletheracetate (PGMEA), 1-methyl-2-pyrrolidinone, cyclohexanone, ethyl lactate, ethyletheracetate, ethyl 3-ethoxypropionate, methyl 3-methoxypropionate, and dimethyl sulfoxide.

The composition may not include a separate cross-linking agent.

The embodiments may also be realized by providing a method for patterning an underlying material layer on a substrate, the method including providing a material layer on a substrate; forming an anti-reflective underlayer on the material layer using the composition of an embodiment; forming a radiation-sensitive imaging layer on the anti-reflective underlayer; patternwise exposing the radiation-sensitive imaging layer to radiation to form a pattern of radiation-exposed regions in the imaging layer; selectively removing portions of the radiation-sensitive imaging layer and the underlayer to expose portions of the material layer; and etching the exposed portions of the material layer to pattern the material layer.

Forming the anti-reflective underlayer may include spin coating the composition on the substrate having the material layer thereon.

DETAILED DESCRIPTION

Korean Patent Application No. 10-2008-0121350, filed on Dec. 2, 2008, in the Korean Intellectual Property Office, and entitled: "Underlayer Composition Having Anti-Reflective Property," is incorporated by reference herein in its entirety.

Example embodiments will now be described; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

An embodiment provides an aromatic ring-containing polymer having high absorption at short wavelength regions (e.g., 157 nm, 193 nm, and/or 248 nm).

The aromatic ring-containing polymer may include a group represented by one of the following Chemical Formulae 1-1, 1-2, 2-1, and 2-2.

[Chemical Formula 1-1]

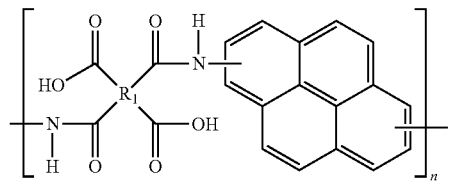

[Chemical Formula 1-2]

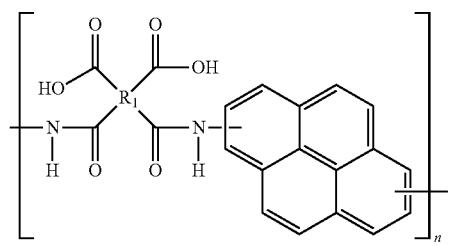

In Chemical Formulae 1-1 and 1-2, $1 \leq n < 250$, and $R_1$ may be a tetravalent moiety represented by one of the following Chemical Formula 1A.

[Chemical Formula 1A]

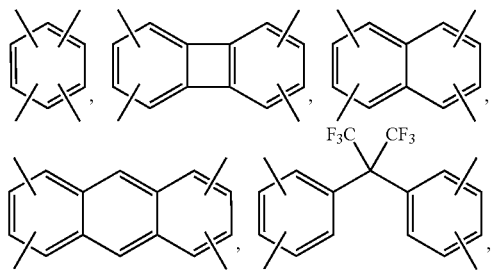

[Chemical Formula 2-1]

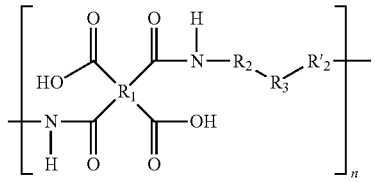

[Chemical Formula 2-2]

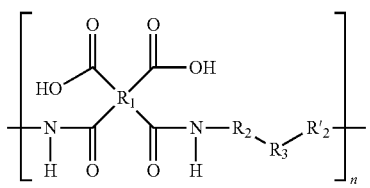

In Chemical Formulae 2-1 and 2-2, 1≤n<250, $R_1$ may be the same as described above with respect to Chemical Formula 1, each $R_2$ and $R'_2$ may independently be a divalent moiety represented by one the following Chemical Formula 2A, and $R_3$ may be a divalent moiety represented by one of the following Chemical Formula 2B.

[Chemical Formula 2A]

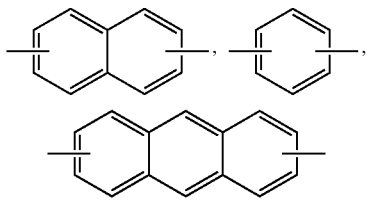

[Chemical Formula 2B]

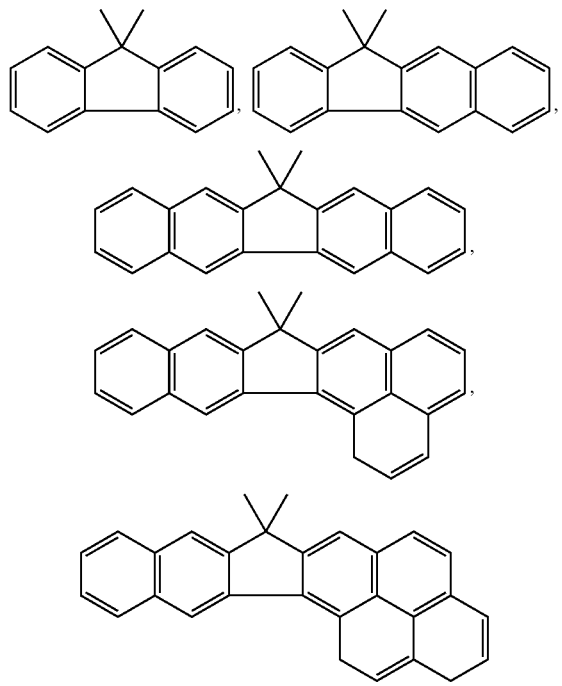

In Chemical Formula 2B, the lines represent bonds, e.g., the groups are divalent fluorene groups wherein the bonds are at the 9-position. The aromatic ring-containing polymer (a) may have a weight average molecular weight of about 1,000 to about 50,000.

In an implementation, the moiety represented by Chemical Formula 1A may be represented by the following Chemical Formula 1A(i):

[Chemical Formula 1A(i)]

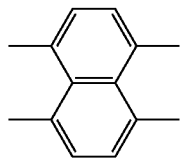

The embodiments also provide an anti-reflective underlayer composition. The anti-reflective underlayer composition may include (a) at least one aromatic ring-containing polymer including a group represented by the above Chemical Formulae 1 and 2 (having high absorption at a short wavelength region), and (b) an organic solvent.

In the underlayer composition prepared according to an embodiment, the (a) aromatic ring of the aromatic ring-containing polymer may exist in a frame portion or backbone of the polymer. Also, the aromatic ring-containing polymer may facilitate a self-curing reaction through an imide reaction between a —COOH group and a —CONH group existing in the frame during a high-temperature heat treatment. Accordingly, it may be possible to form a film without a cross-linking component. As a result of the self-curing reaction, a hardmask layer having sufficient chemical resistance may be prepared. Also, the underlayer composition may exhibit solution and film-forming characteristics contributing to the formation of a film through conventional spin-coating.

According to an embodiment, the underlayer composition may include the aromatic ring-containing polymer including a group represented by the above Chemical Formula 1 or 2, and may satisfy the above conditions.

The aromatic ring-containing polymer (a) may be used or included in an amount of about 1 to about 30 parts by weight, based on 100 parts by weight of the organic solvent (b). Maintaining the amount of the aromatic ring-containing polymer at about 1 to about 30 parts by weight may help ensure that a desirable coating thickness is easily obtained.

Suitable organic solvents (b) that may be used to dissolve the aromatic ring-containing polymer (a) may include, e.g., propylene glycol monomethyletheracetate (PGMEA), 1-methyl-2-pyrrolidinone, cyclohexanone, ethyl lactate, ethyletheracetate, ethyl 3-ethoxypropionate, methyl 3-methoxypropionate, dimethyl sulfoxide, and the like.

The underlayer composition of an embodiment may include about 1 to about 30 wt % of the aromatic ring-containing polymer (having high absorption in a short wavelength region), and preferably about 3 to about 15 wt %, based on a total weight of the composition. The underlayer composition of an embodiment may include about 70 to about 99 wt % of the organic solvent, based on the total weight of the composition. Including the components of the composition in the above-described amounts may help ensure that a target coating thickness is achieved.

The underlayer composition of an embodiment may further include an additive, e.g., a surfactant.

The embodiments also provide a method for patterning an underlying material layer on a substrate by using the underlayer composition.

For example, the method may include (a) providing a material layer on a substrate, (b) forming an anti-reflective underlayer on the material layer using the composition of an embodiment, (c) forming a radiation-sensitive imaging layer on the anti-reflective underlayer, (d) patternwise exposing the radiation-sensitive imaging layer to radiation to form a pattern of radiation-exposed regions in the imaging layer, (e)

selectively removing portions of the radiation-sensitive imaging layer and the underlayer to expose portions of the material layer, and (f) etching the exposed portions of the material layer to pattern the material layer.

In an implementation, the method of an embodiment may be carried out in accordance with the following procedure. First, a material (e.g., aluminum or silicon nitride (SiN)) to be patterned may be applied to a silicon substrate by any suitable technique. The material may be, e.g., an electrically conductive, semi-conductive, magnetic, or insulating material. Then, the underlayer composition of an embodiment may be spin-coated to a thickness of about 500 to about 4,000 Å and baked at about 100 to about 300° C. for about 10 seconds to about 30 minutes to form an anti-reflective underlayer. After the anti-reflective underlayer is formed, a radiation-sensitive imaging layer may be formed. Then, development of the imaging layer may be performed to expose a portion to be patterned through exposure. Then, the imaging layer and the anti-reflective underlayer may be selectively removed to expose a portion of the material layer. In an implementation, dry etching using a $CHF_3/CF_4$ mixed gas may be performed. After a patterned material layer is formed, predetermined resists may be removed using general photoresist strippers. Through such a method, a semiconductor integrated circuit device may be provided.

Accordingly, the composition of an embodiment and the resulting lithographic structure may be used in the fabrication and design of integrated circuit devices. For example, the composition of an embodiment may be used in the formation of patterned material layer structures, e.g., metal wiring, holes for contacts and biases, insulating sections (e.g., damascene trenches (DTs) and shallow trench isolation (STI)), and trenches for capacitor structures. It should be appreciated that the embodiments are not restricted to any particular lithographic techniques and device structures.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis Example 1

Copolymer synthesis of 9,9'-bis(aminonaphthalene)fluorene and pyromellitic dianhydride A 5,000 ml 3-neck flask equipped with a thermometer, an impeller, a dropping funnel, and a nitrogen tube was prepared and placed in a water bath set to room temperature. Agitation was performed using the impeller, and the atmosphere inside the reactor was nitrogen. 448.56 g (~1 mol) of 9,9'-bis(aminonaphthalene)fluorene was added into the reactor and dissolved in 1807.57 g of 1-methyl-2-pyrrolidinone. Subsequently, 205.34 g (~0.95 mol) of pyromellitic dianhydride was added to the reactor and agitated under the nitrogen atmosphere for 12 hours. After the reaction, the reactant was added dropwise to 10 kg of ethanol to form a precipitate. The acquired precipitate was then dissolved in 1-methyl-2-pyrrolidinone. Subsequently, remaining ethanol was removed through rotation evaporation performed at 60° C. for 20 minutes. The molecular weight and polydispersity of the acquired copolymer were measured through a GPC in the presence of tetrahydrofuran. The weight average molecular weight of the copolymer was 10,000 and the polydispersity was 2.1. The polymer was a mixture of the polymers represented by the following Chemical Formulae 3-1 and 3-2.

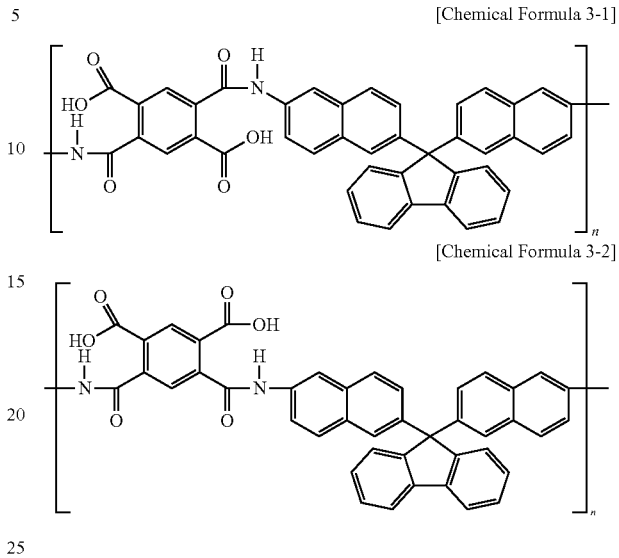

[Chemical Formula 3-1]

[Chemical Formula 3-2]

In Chemical Formulae 3-1 and 3-2, n denotes a polymerization degree.

Synthesis Example 2

Copolymer synthesis of 1,6-diaminopyrene and pyromellitic dianhydride

A 5,000 ml 3-neck flask equipped with a thermometer, an impeller, a dropping funnel, and a nitrogen tube was prepared and impregnated in a water bath set to room temperature. Agitation was performed using the impeller, and the atmosphere inside the reactor was nitrogen. 234.30 g (~1 mol) of 1,6-diaminopyrene was added into the reactor and dissolved in 1807.57 g of 1-methyl-2-pyrrolidinone. Subsequently, 205.34 g (~0.95 mol) of pyromellitic dianhydride was added and agitated under the nitrogen atmosphere for 12 hours. After the reaction, the reactant was added dropwise to 10 kg of ethanol to form a precipitate. Then, the acquired precipitate was dissolved in 1-methyl-2-pyrrolidinone. Subsequently, rotation evaporation was performed at 60° C. for 20 minutes to remove the remaining ethanol. The molecular weight and polydispersity of the acquired copolymer were measured through GPC in the presence of tetrahydrofuran. The weight average molecular weight of the acquired copolymer was 9,000 and the polydispersity was 1.8. The polymer was a mixture of polymers represented by the following Chemical Formulae 4-1 and 4-2.

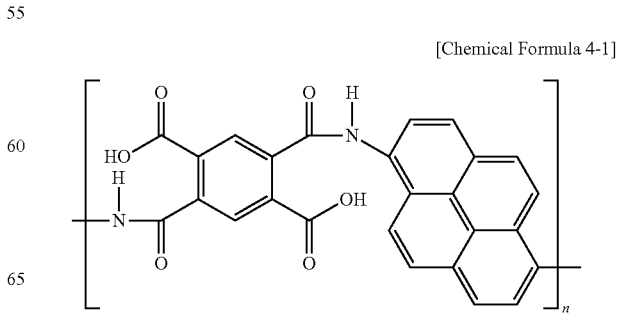

[Chemical Formula 4-1]

[Chemical Formula 4-2]

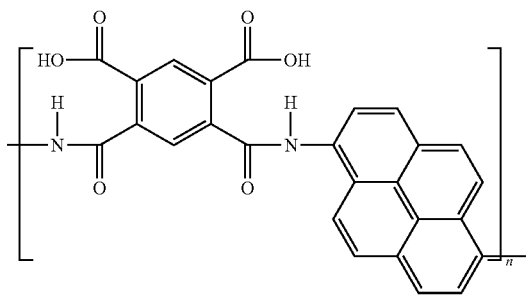

In Chemical Formulae 4-1 and 4-2, n denotes a polymerization degree.

Synthesis Example 3

Copolymer synthesis of fluorenylidenediphenol and 1,4-bismethoxymethylbenzene 8.75 g of α,α'-dichloro-p-xylene (0.05 mol), 26.66 g of aluminum chloride, and 200 g of γ-butyrolactone were put into a 1 l 4-neck flask equipped with a mechanical agitator, a cooling tube, a 300 ml dropping funnel, and a nitrogen gas introduction tube and agitated, while nitrogen gas flowed into the 1 l 4-neck flask. In 10 minutes, a solution prepared by dissolving 35.03 g of 4,4'-(9-fluorenylidene)diphenol (0.10 mol) in 200 g of γ-butyrolactone was slowly added dropwise for 30 minutes, and reacted for 12 hours. After the reaction, acid was removed using water and condensed with an evaporator. Subsequently, the reactant was diluted using methylamylketone (MAK) and methanol, and adjusted using a 15 wt % MAK/methanol solution prepared by mixing MAK and methanol in a weight ratio of 4:1. The resultant solution was put into a 3 l separatory funnel, and low molecular weight substances containing unreacted monomer were removed by adding n-heptane. As a result, a polymer (Mw=12,000, polydispersity=2.0, n=23) represented by the following Chemical Formula 5 was acquired.

[Chemical Formula 5]

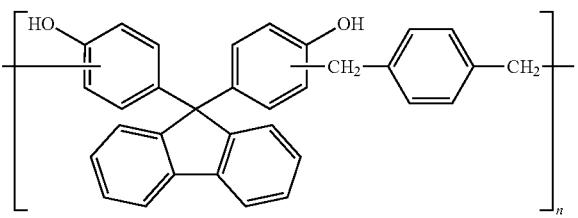

In Chemical Formula 5, n denotes a polymerization degree.

Examples 1 and 2

0.8 g of the polymers prepared according to Synthesis Examples 1 and 2 were respectively dissolved in 10 g of 1-methyl-2-pyrrolidinone to thereby prepare the solutions of Examples 1 and 2, respectively.

Comparative Example 1

0.8 g of the polymer prepared according to Synthesis Example 3, 0.2 g of a cross-linking agent (Cymel 303), and 2 mg of pyridinium p-toluene sulfonate were put into 9 g of PGMEA, dissolved therein, and filtered to thereby prepare a sample solution.

Experimental Example 1

Each of the sample solutions prepared in Examples 1 and 2 and Comparative Example 1 was spin-coated on a silicon wafer and baked at 250° C. for 180 seconds to form a 3,500 Å-thick film.

The refractive index (n) and extinction coefficient (k) of the films were measured using an ellipsometer (J. A. Woollam). The results are shown in Table 1.

TABLE 1

| Sample | Optical property at 193 nm | | Optical property at 248 nm | |
| --- | --- | --- | --- | --- |
| | n (refractive index) | k (extinction coefficient) | n (refractive index) | k (extinction coefficient) |
| Comparative Example 1 | 1.44 | 0.70 | 1.97 | 0.27 |
| Example 1 | 1.54 | 0.77 | 2.31 | 0.63 |
| Example 2 | 1.47 | 0.64 | 2.05 | 0.59 |

The assessment results showed that the films formed of the compositions prepared according to Examples 1 and 2 exhibited suitable refractive indices and absorption for an anti-reflection layer in the wavelength of ArF (193 nm) and KrF (248 nm).

On the other hand, the film formed of the composition prepared according to Comparative Example 1 had a low extinction characteristic in the wavelength of KrF (248 nm).

Experimental Example 2

Each of the sample solutions prepared in Examples 1 and 2 and Comparative Example 1 was spin-coated on a silicon wafer covered with aluminum and baked at 250° C. for 60 seconds to form a 3,500 Å-thick film.

A KrF photoresist was coated on each film, baked at 110° C. for 60 seconds, exposed to light using an exposure system (ASML, XT: 1400, NA 0.93), and developed with an aqueous solution of TMAH (2.38 wt %). 90 nm line and space patterns were observed using a field emission scanning electron microscope (FE-SEM). The photoresist patterns were measured for exposure latitude (EL) margin as a function of exposure energy and depth of focus (DoF) margin as a function of the distance from a light source. In addition, a pattern profile was observed. The results are shown in Table 2.

TABLE 2

| | Pattern property | | |
| --- | --- | --- | --- |
| Sample used in the formation of film | EL margin (ΔmJ/exposure energy mJ) | DoF margin (Mm) | Profile |
| Comparative Example 1 | 0.1 | 0.1 | Undercut |
| Example 1 | 0.2 | 0.2 | Cubic |
| Example 2 | 0.2 | 0.2 | Cubic |

According to the pattern assessment results, the films formed of the compositions prepared according to Examples 1 and 2 were fine in terms of pattern profile or margins. However, in the case of the composition prepared according to Comparative Example 1, the result was disadvantageous in terms of pattern profile or margins. It is believed that the different results originated from the difference in absorption characteristics, i.e., extinction coefficient, at the wavelength of KrF (248 nm).

Experimental Example 3

The specimens patterned in Experimental Example 2 were dry-etched using a mixed gas of $CHF_3/CF_4$, and then dry-etched again using a mixed gas of $BCl_3/Cl_2$. Lastly, all the remaining organic materials were removed using oxygen ($O_2$) gas, and their cross-sections were observed with FE-SEM. The results were as shown in Table 3.

TABLE 3

| Sample used in the formation of film | Pattern profile after etching |
| --- | --- |
| Comparative Example 1 | Tapered, coarse surface |
| Example 1 | Vertical |
| Example 2 | Vertical |

According to the etch assessment results, the films formed of the compositions prepared according to Examples 1 and 2 showed fine etch selectivity and pattern forming characteristics.

However, the film formed of the composition prepared according to Comparative Example 1 showed a taper effect occurring in the etch profile. It is believed that the taper effect originated from insufficient selectivity in the corresponding etch conditions.

By way of summation and review, a typical lithographic process may include patternwise exposure of a radiation-sensitive resist to imaging radiation to form a patterned resist layer. Then, an image may be developed by bringing the exposed resist layer into contact with a certain substance (e.g., an aqueous alkaline developing solution). Then, the underlying material exposed by openings of the patterned resist layer may be etched to transfer a pattern to the underlying material. After completion of the transfer, remaining portions of the resist layer may be removed.

For better resolution, an anti-reflective coating (ARC) may be used to minimize the reflectivity between an imaging layer, e.g., the radiation-sensitive resist material layer, and the underlying material layer. However, many portions of the imaging layer may be removed during etching of the ARC, after patterning. Thus, patterning may be further required in the subsequent etching step.

For example, in some lithographic imaging processes, the resist may not provide resistance to the subsequent etching step to an extent that is sufficient to effectively transfer the desired pattern to a layer underlying the resist. In actual applications (e.g., in a case in which an extremely thin resist layer is required, an underlying material to be etched is thick, a large etching depth is needed, and/or the use of a particular etchant is required depending on the type of underlying material), a so-called "hardmask layer" may be used as an intermediate layer between the patterned resist layer and the underlying material that can be patterned by transfer from the patterned resist. The hardmask layer should be able to receive the pattern from the patterned resist layer and withstand etching required to transfer the pattern to the underlying material.

Some hardmask materials may be difficult to apply to substrates. Thus, the use of chemical and physical vapor deposition, special solvents, and/or high-temperature baking may be required.

Accordingly, the embodiments provide an underlayer composition, e.g., an anti-reflective hardmask composition that can be applied by spin-coating techniques. The embodiments also provide an underlayer composition that can be selectively etched using an overlying photoresist layer as a mask in an easy manner, while being resistant to etching necessary to pattern an underlying metal or silicon compound layer using a hardmask layer as a hardmask. The embodiments also provide a hardmask composition that provides superior storage properties and avoids unwanted interactions (e.g., acid pollution from a hardmask) with an imaging resist layer. For example, the composition, when used, shows minimal remaining acid. The embodiments also provide an underlayer composition that has particular optical properties against imaging radiation at shorter wavelengths (e.g., 157 nm, 193 nm, and 248 nm).

For example, the embodiments provide an underlayer composition that is suitable for use in a lithographic process that exhibits high etch selectivity, is sufficiently resistant to multiple etching, and minimizes reflectivity between a resist and the underlayer.

Thus, the anti-reflective underlayer composition of an embodiment may be used to form a film having a refractive index and absorbance suitable for use as an anti-reflective film in the deep UV (DUV) range (e.g., ArF (193 nm) and KrF (248 nm)). Therefore, the anti-reflective underlayer composition of an embodiment may exhibit very high etch selectivity for lithography and may be sufficiently resistant to multiple etching. Furthermore, the anti-reflective hardmask composition of an embodiment may minimize the reflectivity between a resist and an underlying layer. Thus, it may be used to provide a lithographic structure that has better results in terms of pattern profile and margins.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An aromatic ring-containing polymer including a group represented by one of the following Chemical Formulae 1-1, 1-2, 2-1, and 2-2:

[Chemical Formula 1-1]

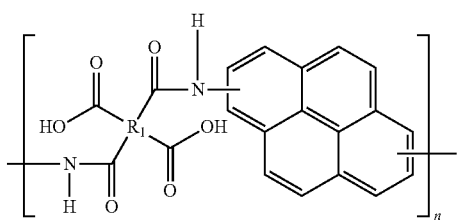

[Chemical Formula 1-2]

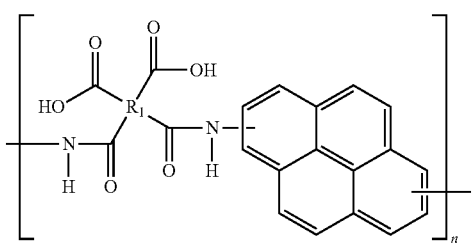

wherein, in Chemical Formulae 1-1 and 1-2, 1≤n<250 and $R_1$ is a moiety represented by one of the following Chemical Formula $1A_1$:

[Chemical Formula $1A_1$]

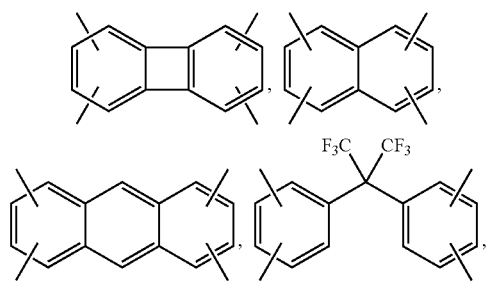

[Chemical Formula 2-1]

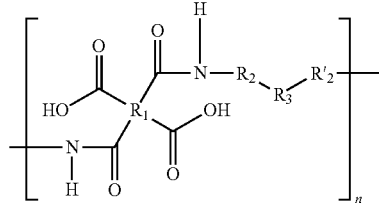

[Chemical Formula 2-2]

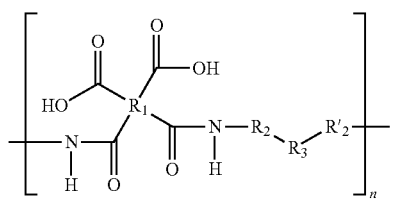

wherein, in Chemical Formulae 2-1 and 2-2, 1≤n<250, $R_1$ is a moiety represented by one of the following Chemical Formula $1A_2$:

[Chemical Formula $1A_2$]

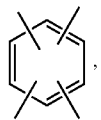 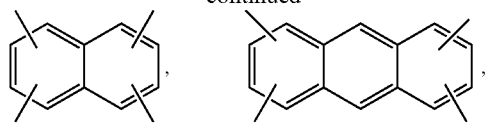

each $R_2$ and $R'_2$ is independently a moiety represented by one of the following Chemical Formula 2A, and $R_3$ is a moiety represented by one of the following Chemical Formula 2B:

[Chemical Formula 2A]

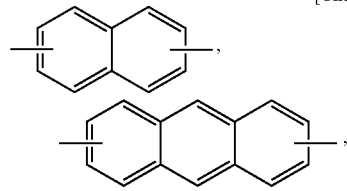

[Chemical Formula 2B]

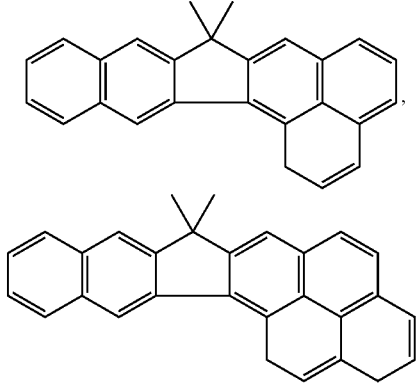

2. The aromatic ring-containing polymer as claimed in claim 1, wherein the aromatic ring-containing polymer has a weight average molecular weight of about 1,000 to about 50,000.

3. The aromatic ring-containing polymer as claimed in claim 1, wherein the moiety represented by Chemical Formulae $1A_1$ and $1A_2$ is:

[Chemical Formula 1A(i)]

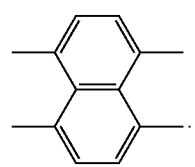

4. An integrated circuit device comprising a layer including the aromatic ring-containing polymer as claimed in claim 1.

5. An anti-reflective underlayer composition, comprising:

an organic solvent; and an aromatic ring-containing polymer including a group represented by at least one of Chemical Formulae 1-1, 1-2, 2-1, and 2-2,

[Chemical Formula 1-1]

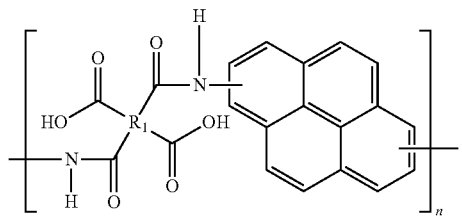

[Chemical Formula 1-2]

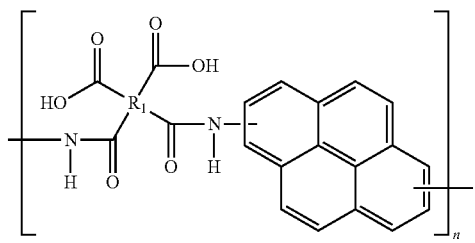

wherein, in Chemical Formulae 1-1 and 1-2, 1≤n<250, $R_1$ is a moiety represented by one of the following Chemical Formula $1A_1$,

[Chemical Formula $1A_1$]

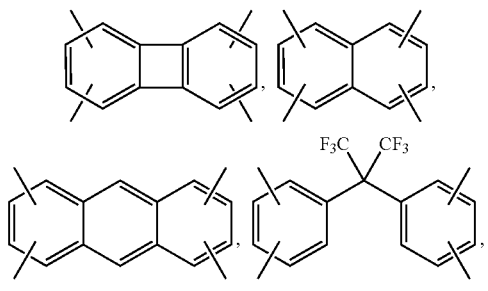

[Chemical Formula 2-1]

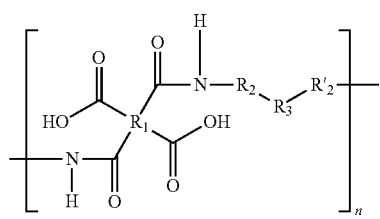

[Chemical Formula 2-2]

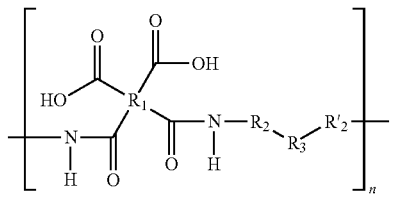

wherein, in Chemical Formulae 2-1 and 2-2, 1≤n<250, $R_1$ is a moiety represented by one of the following Chemical Formula $1A_2$:

[Chemical Formula $1A_2$]

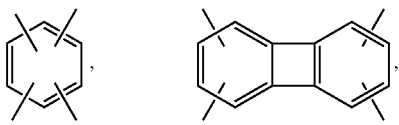

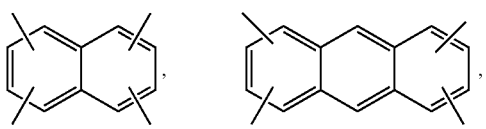

each $R_2$ and $R'_2$ is independently a moiety represented by one of the following Chemical Formula 2A, and $R_3$ is a moiety represented by one of the following Chemical Formula 2B:

[Chemical Formula 2A]

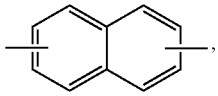

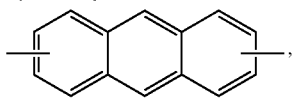

[Chemical Formula 2B]

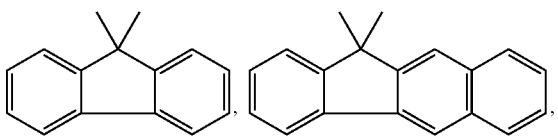

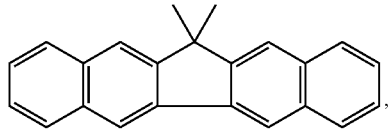

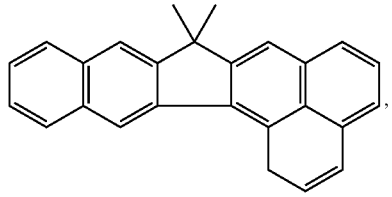

-continued

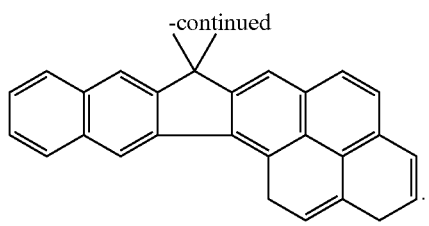

6. The anti-reflective underlayer composition as claimed in claim 5, wherein the moiety represented by Chemical Formulae $1A_1$ and $1A_2$ is represented by the following Chemical Formula 1A(i):

[Chemical Formula 1A(i)]

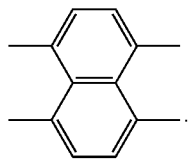

7. The anti-reflective underlayer composition as claimed in claim 5, wherein the underlayer composition includes:
about 1 to about 30 wt % of the aromatic ring-containing polymer; and
about 70 to about 99 wt % of the organic solvent, based on a total weight of the composition.

8. The anti-reflective underlayer composition as claimed in claim 7, wherein the underlayer composition includes about 3 to about 15 wt % of the aromatic ring-containing polymer, based on the total weight of the composition.

9. The anti-reflective underlayer composition as claimed in claim 5, wherein the aromatic ring-containing polymer has a weight average molecular weight of about 1,000 to about 50,000.

10. The anti-reflective underlayer composition as claimed in claim 5, further comprising a surfactant.

11. The anti-reflective underlayer composition as claimed in claim 5, wherein the organic solvent includes at least one of propylene glycol monomethyletheracetate (PGMEA), 1-methyl-2-pyrrolidinone, cyclohexanone, ethyllactate, ethyletheracetate, ethyl 3-ethoxypropionate, methyl 3-methoxypropionate, and dimethyl sulfoxide.

12. The anti-reflective underlayer composition as claimed in claim 5, wherein the composition does not include a separate cross-linking agent.

13. A method for patterning an underlying material layer on a substrate, the method comprising:
providing a material layer on a substrate;
forming an anti-reflective underlayer on the material layer using an anti-reflective underlayer composition;
forming a radiation-sensitive imaging layer on the anti-reflective underlayer;
patternwise exposing the radiation-sensitive imaging layer to radiation to form a pattern of radiation-exposed regions in the imaging layer;
selectively removing portions of the radiation-sensitive imaging layer and the underlayer to expose portions of the material layer; and
etching the exposed portions of the material layer to pattern the material layer, wherein the anti-reflective underlayer composition includes:
an organic solvent; and
an aromatic ring-containing polymer including a group represented by at least one of Chemical Formulae 1-1, 1-2, 2-1, and 2-2,

[Chemical Formula 1-1]

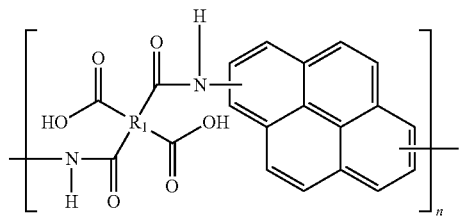

[Chemical Formula 1-2]

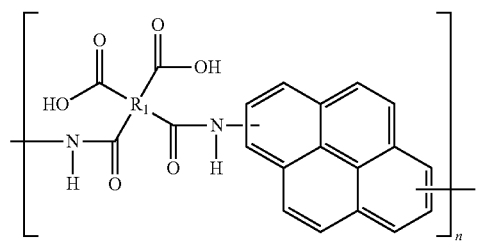

wherein, in Chemical Formulae 1-1 and 1-2, $1 \leq n < 250$, $R_1$ is a moiety represented by one of the following Chemical Formula 1A,

[Chemical Formula 1A]

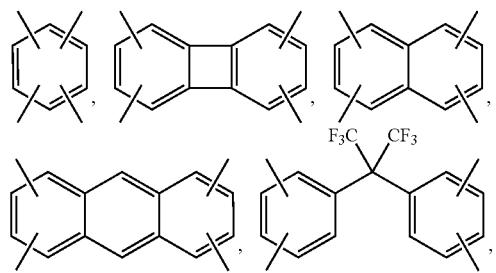

[Chemical Formula 2-1]

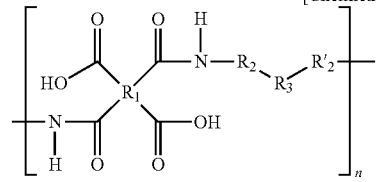

[Chemical Formula 2-2]

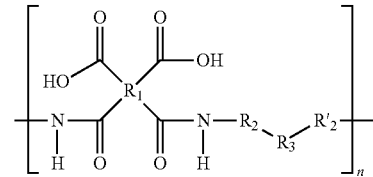

wherein, in Chemical Formulae 2-1 and 2-2, $1 \leq n < 250$, $R_1$ is the same as in Chemical Formula 1, each $R_2$ and $R'_2$ is independently a moiety represented by one of the following Chemical Formula 2A, and R₃ is a moiety represented by one of the following Chemical Formula 2B:

[Chemical Formula 2A]

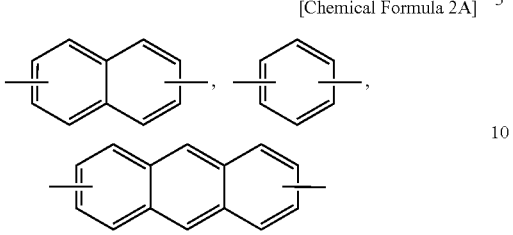

[Chemical Formula 2B]

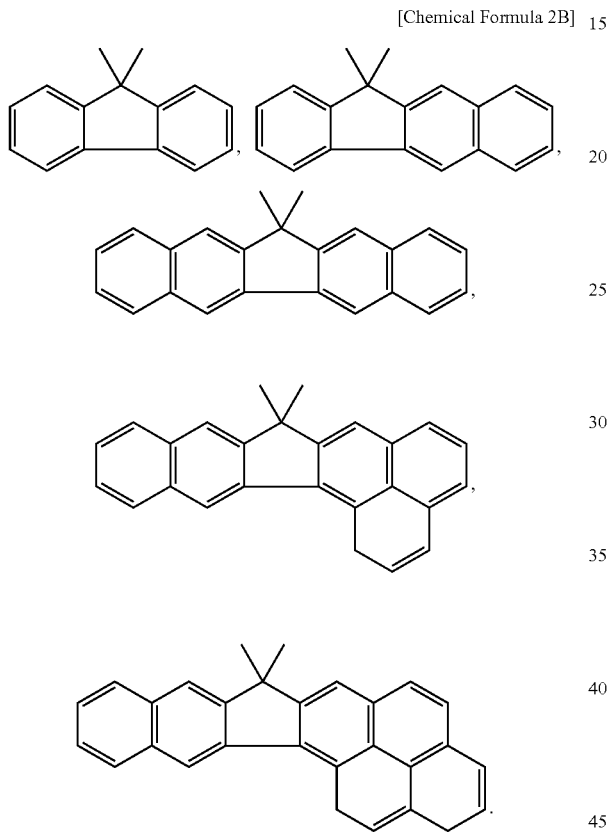

14. The method as claimed in claim 13, wherein forming the anti-reflective underlayer includes spin coating the composition on the substrate having the material layer thereon.

15. An integrated circuit device comprising a layer including an aromatic ring-containing polymer, the aromatic ring-containing polymer including a group represented by one of the following Chemical Formulae 1-1, 1-2, 2-1, and 2-2:

[Chemical Formula 1-1]

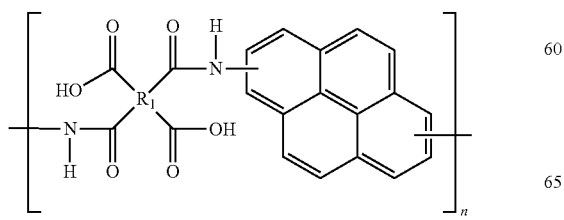

[Chemical Formula 1-2]

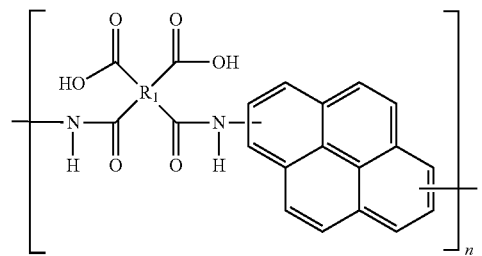

wherein, in Chemical Formulae 1-1 and 1-2, 1≤n<250 and R₁ is a moiety represented by one of the following Chemical Formula 1A₁:

[Chemical Formula 1A₁]

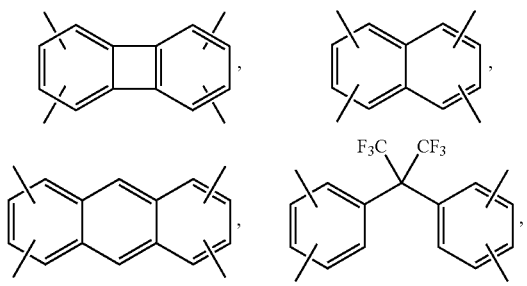

[Chemical Formula 2-1]

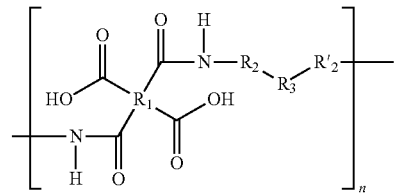

[Chemical Formula 2-2]

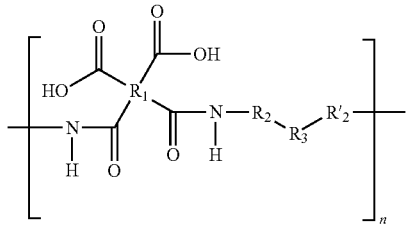

wherein, in Chemical Formulae 2-1 and 2-2, 1≤n<250, R₁ is a moiety represented by one of the following Chemical Formula 1A₂:

[Chemical Formula 1A₂]

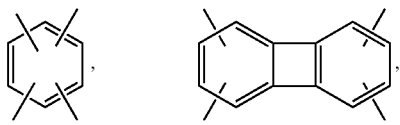

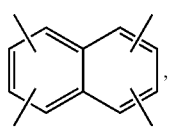 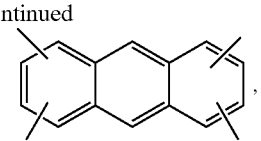 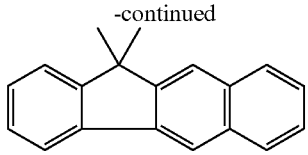
each $R_2$ and $R'_2$ is independently a moiety represented by one of the following Chemical Formula 2A, and $R_3$ is a moiety represented by one of the following Chemical Formula 2B:
[Chemical Formula 2A]
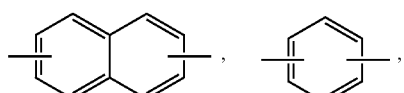
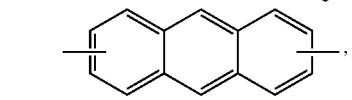
[Chemical Formula 2B]
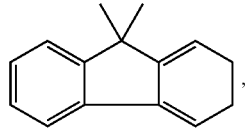
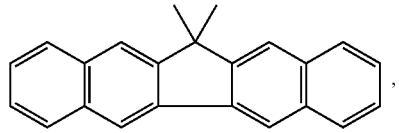
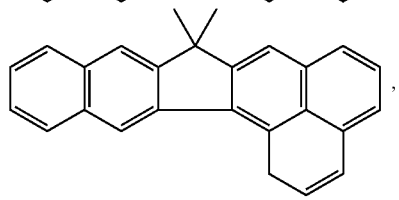
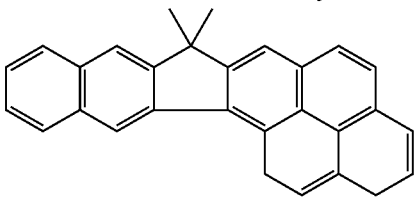
* * * * *